(12) United States Patent
Arce et al.

(10) Patent No.: US 9,343,491 B2
(45) Date of Patent: May 17, 2016

(54) SPECTRAL IMAGING SENSORS AND METHODS

(71) Applicants: Gonzalo Arce, Newark, DE (US);
 Henry Arguello Fuentes, Newark, DE (US)

(72) Inventors: Gonzalo Arce, Newark, DE (US);
 Henry Arguello Fuentes, Newark, DE (US)

(*) Notice: Subject to any disclaimer, the term of this patent is extended or adjusted under 35 U.S.C. 154(b) by 49 days.

(21) Appl. No.: 14/270,929

(22) Filed: May 6, 2014

(65) Prior Publication Data

US 2014/0374573 A1 Dec. 25, 2014

Related U.S. Application Data

(60) Provisional application No. 61/819,700, filed on May 6, 2013.

(51) Int. Cl.
| | |
|---|---|
| *G01J 3/28* | (2006.01) |
| *H01L 27/146* | (2006.01) |
| *G01J 3/06* | (2006.01) |
| *G01J 3/14* | (2006.01) |
| *G01J 3/02* | (2006.01) |

(52) U.S. Cl.
 CPC ......... *H01L 27/14625* (2013.01); *G01J 3/0229* (2013.01); *G01J 3/06* (2013.01); *G01J 3/14* (2013.01); *G01J 3/2823* (2013.01); *H01L 27/14621* (2013.01)

(58) Field of Classification Search
 CPC ......... G01J 3/02; G01J 3/0229; G01J 3/2823; G01J 3/2846
 See application file for complete search history.

(56) References Cited

U.S. PATENT DOCUMENTS

| | | |
|---|---|---|
| 5,627,639 A | 5/1997 | Mende |
| 7,336,353 B2 | 2/2008 | Brady |
| 7,648,808 B2 | 1/2010 | Buchsbaum |
| 8,149,400 B2 | 4/2012 | Brady |
| 8,455,811 B2 * | 6/2013 | Tay et al. ............. 250/226 |
| 2010/0253941 A1 | 10/2010 | Brady |

OTHER PUBLICATIONS

Arguello, H. et al., "Higher-Order Computational Model for Coded Aperture Spectral Imaging," Applied Optics, vol. 52, No. 10, Apr. 1, 2013, pp. D12-D21.

Arguello, H. et al., "Rank Minimization Code Aperture Design for Spectrally Selective Compressive Imaging," IEEE Transactions on Image Processing, vol. 22, No. 3, Mar. 2013, pp. 941-954.

(Continued)

*Primary Examiner* — Tony Ko
(74) *Attorney, Agent, or Firm* — RatnerPrestia

(57) ABSTRACT

Spectral imaging sensors and methods are disclosed. A spectral imaging sensor includes a color-coded array of apertures positioned to receive light from an object to be imaged. The array includes a first plurality of apertures configured to pass light in a first predetermined wavelength range and a second plurality of apertures configured to pass light in a second predetermined wavelength range different from the first predetermined wavelength range. The imaging sensor further includes one or more optical elements positioned to receive light passing through the color-coded array, and a photodetector positioned to receive light from the one or more optical elements. A spectral imaging method includes the steps of filtering light from an object to be imaged through a color-coded array of apertures, redirecting the filtered light with one or more optical elements, and receiving the redirected light with a photodetector.

21 Claims, 5 Drawing Sheets

(56) References Cited

OTHER PUBLICATIONS

Arguello, H. et al., "Restricted Isometry Property in Coded Aperture Compressive Spectral Imaging," 2012 IEEE Statistical Signal Processing Workshop (SSP), pp. 716-719, Aug. 5-8, 2012.

Wagadarikar, A. et al., "Single Disperset Design for Coded Aperture Snapshot Spectral Imaging," Applied Optics, vol. 47, No. 10, Apr. 1, 2008, pp. B44-B51.

* cited by examiner

SPECTRAL IMAGING SENSORS AND METHODS

CROSS REFERENCE TO RELATED APPLICATIONS

This application claims priority to U.S. patent application Ser. No. 61/819,700, entitled "Spatio-Spectrally Colored Coded Patterned Apertures and Sensors," filed May 6, 2013, the contents of which are incorporated herein by reference in their entirety.

STATEMENT REGARDING FEDERALLY SPONSORED RESEARCH

This invention may have been made with support under Contract No. N00014-10-C-0199 from the Office of Naval Research. The government may have rights in this invention.

FIELD OF THE INVENTION

The present invention relates generally to spectral imaging, and more particularly, to spectral imaging sensors and methods employing color-coded arrays.

BACKGROUND OF THE INVENTION

In recent years, the ability to acquire spectral information for a field of view has become desirable in photographic and spectroscopic applications. Such information can include a complete spectrum or just some spectral information at every location in an image plane. As such, spectral image sensors must be capable of obtaining a large amount of spatial information across a multitude of wavelengths in a field of view ("spatio-spectral information").

Traditional spectral imaging sensing techniques scan adjacent zones of the underlying spectral scene and merge the results to construct a spectral data cube. A disadvantage of these techniques is that they require linearly scanning the number of zones in proportion to the desired spatial or spectral resolution. While compressive spectral imaging (CSI) techniques may limit the scanning requirements of traditional techniques, they may also undesirably increase the processing time required for obtaining useful spectral images. Accordingly, improved spectral image sensors and spectral image sensing techniques are desired.

SUMMARY OF THE INVENTION

Aspects of the present invention are directed to spectral imaging sensors and methods.

In accordance with one aspect of the present invention, a spectral imaging sensor includes a color-coded array of apertures positioned to receive light from an object to be imaged. The array includes a first plurality of apertures configured to pass light in a first predetermined wavelength range and a second plurality of apertures configured to pass light in a second predetermined wavelength range different from the first predetermined wavelength range. The imaging sensor further includes one or more optical elements positioned to receive light passing through the color-coded array, and a photodetector positioned to receive light from the one or more optical elements.

In accordance with another aspect of the present invention, a spectral imaging sensor includes one or more optical elements positioned to receive light from an object to be imaged, a photodetector array positioned to receive light passing through the one of more optical elements; and a color-coded array of apertures positioned adjacent a surface of the photodetector array between the photodetector array and the one or more optical elements. The color-coded array includes a first plurality of apertures configured to pass light in a first predetermined wavelength range and a second plurality of apertures configured to pass light in a second predetermined wavelength range different from the first predetermined wavelength range.

In accordance with yet another aspect of the present invention, a spectral imaging method includes the steps of filtering light from an object to be imaged through a color-coded array of apertures, the array including a first plurality of apertures configured to pass light in a first predetermined wavelength range and a second plurality of apertures configured to pass light in a second predetermined wavelength range different from the first predetermined wavelength range, redirecting the filtered light with one or more optical elements, and receiving the redirected light with a photodetector.

BRIEF DESCRIPTION OF THE DRAWINGS

The invention is best understood from the following detailed description when read in connection with the accompanying drawings, with like elements having the same reference numerals. When a plurality of similar elements are present, a single reference numeral may be assigned to the plurality of similar elements with a small letter designation referring to specific elements. When referring to the elements collectively or to a non-specific one or more of the elements, the small letter designation may be dropped. This emphasizes that according to common practice, the various features of the drawings are not drawn to scale unless otherwise indicated. On the contrary, the dimensions of the various features may be expanded or reduced for clarity. Included in the drawings are the following figures.

DETAILED DESCRIPTION OF THE INVENTION

Figure 1:
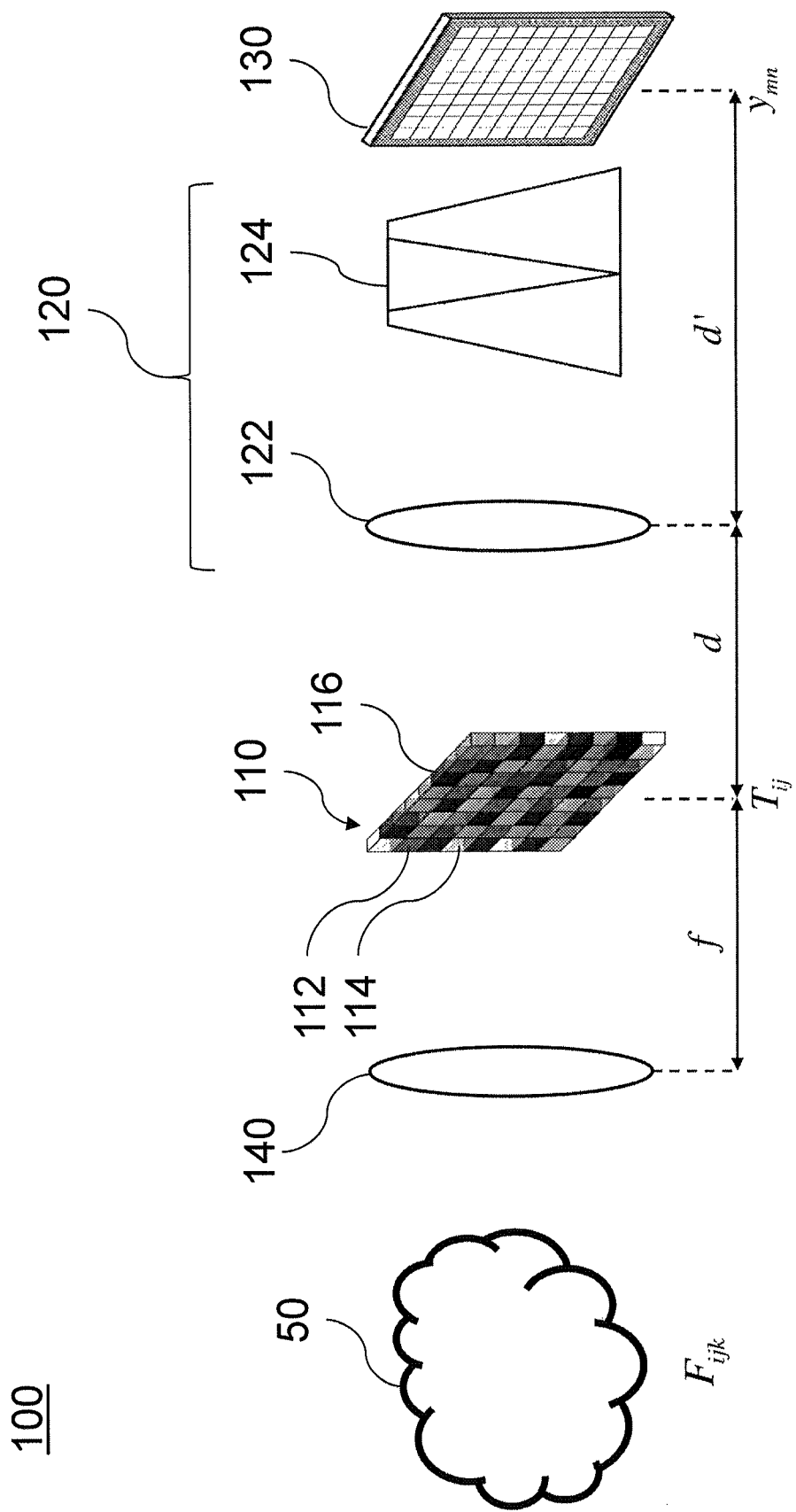
FIG. 1 is a diagram illustrating an exemplary spectral imaging sensor in accordance with aspects of the present invention.

With reference to the drawings, FIG. 1 illustrates an exemplary spectral imaging sensor 100 in accordance with aspects of the present invention. Sensor 100 may be usable in photographic or spectroscopic systems. In general, sensor 100 includes a color-coded array 110, optical elements 120, and a photodetector 130. Additional details of sensor 100 are described below.

Color-coded array 110 is positioned to receive light from an object 50 to be imaged. Color-coded array 110 is formed from a two-dimensional array of different colored apertures that are configured to pass light from object 50 therethrough. The different colors used for apertures can be selected from any region of the optical or near-optical electromagnetic spectrum, from ultraviolet to long-wave infrared. The color-coded array 110 thus represents a 3D array, where the two axes orthogonal to the light from object 50 represent a spatial distribution, and the third axis parallel to the light from object 50 represents a spectral distribution.

The apertures in array 110 may be formed from transmissive lithographic coatings, reflective micromirrors, or crystal-based spatial light modulators. The size of the apertures may be selected based on manufacturing constraints, or based on the size of pixels of photodetector 130 (where photodetector comprises an array of pixels). In an exemplary embodiment, the apertures are sized to be the same size as or smaller than the pixels in photodetector 130, to enable an appropriate resolution of sensor 100. Suitable processes for fabricating a color-coded array of apertures will be known to one of ordinary skill in the art from the description herein.

In an exemplary embodiment, color-coded array 110 includes apertures of two or more different colors. For example, color-coded array 110 includes a first plurality of apertures 112 having a first color. First plurality of apertures 112 are configured to pass light in a first predetermined wavelength range based on the first color. Color-coded array 110 also includes a second plurality of apertures 114 having a second color. Second plurality of apertures 114 are configured to pass light in a second predetermined wavelength range based on the second color.

While only two pluralities of apertures 112 and 114 are specifically discussed herein, it will be understood that that color-coded array 110 is not so limited. Array 110 may include a third, fourth, or fifth different plurality of colored apertures, as desired. Color-coded array 110 may also include a plurality of apertures 116 that are black or otherwise optically opaque, and are thereby configured to block the passage of light therethrough.

The number of different colors of apertures of color-coded array 110 may be selected based on operating and manufacturing considerations of sensor 100. The greater the number of colors that are included, the greater the diversity of spectral information that can be acquired about object 50 in a single measurement, which may lead to a better spectral image with a minimal amount of processing time. In contrast, the fewer the number of colors included, the less it may cost to fabricate the color-coded array 110. One of ordinary skill in the art will understand from the description herein how to select an appropriate number of colors for color-coded array 110 based on the intended uses and cost constraints for sensor 100.

The colors selected for color-coded array 110 may be selected to minimize the overlap of wavelengths ranges for light passed by array 110. In other words, color-coded array 110 may include a plurality of different, non-overlapping color ranges such that the light in each wavelength range of light from object 50 is passed by only one of the pluralities of apertures in color-coded array 110. In an exemplary embodiment, the second wavelength range of light passed by second plurality of apertures 114 is inverse from the first wavelength range of light passed by first plurality of apertures 112. For example, first plurality of apertures 112 may pass light having a wavelength at or above 500 nm, and second plurality of apertures 114 may pass light having a wavelength below 500 nm.

As will be explained below, sensor 100 may perform multiple measurements of object 50 in creating a spectral image thereof. Each measurement involves collecting light passing through color-coded array 110 with photodetector 130. Thus, the transmittance energy of the apertures in color-coded array 110 may be selected based on the number of measurements to be performed using sensor 100 to acquire each spectral image. For example, where sensor 100 performs K measurements to obtain a spectral image of object 50, the transmittance energy of each aperture in color-coded array 110 may desirably be 1/K, such that the full amount of energy from the light from object 50 is collected only once all measurements are performed.

The positioning of the apertures in color-coded array 110 may impact the ability of sensor 100 to obtain the desired spatio-spectral information about object 50. In one exemplary embodiment, the positioning of the first plurality of apertures 112 and the second plurality of apertures 114 in color-coded array 110 is randomly predetermined.

In another exemplary embodiment, the positioning of the first plurality of apertures 112 and the second plurality of apertures 114 in color-coded array 110 is selected to optimize the locations at which the light through these apertures contacts photodetector 130. This may be particularly desirable where photodetector 130 comprises a photodetector array. The apertures of color-coded array 110 are preferably designed such that, for each pixel in the photodetector array, the entire spectrum of light is sensed no more than once, without overlap. In other words, the colors and positioning of the apertures are selected, along with knowledge of the layout of photodetector 130 and the intervening optical elements 120, so that the entire wavelength range is detected at each pixel location only once.

The positioning of apertures to comply with the above requirements can be determined by one of ordinary skill in the art from the description herein, including the equations set forth in the provisional application, which is incorporated herein by reference. In particular, the location of apertures in color-coded array 110 is optimized based on the measurements of light performed using photodetector 130. Exemplary considerations for optimizing the location of apertures in color-coded array 110 is set forth below.

Each coded aperture can be seen as a two-dimensional (2D) array, where each entry of the array contains information of the spectral response of the coded aperture at the spatial location indexed for that entry. Several coded apertures are optimized jointly such that sets of 2D arrays are obtained as the result of the design process.

Optimal arrays of coded apertures may have one or more of the following spatial and spectral features:

A. At every spatial location, the sum of the spectral responses of the optimal set of coded apertures is constant.

B. The inter-row spectral correlation of every 2D array of the ensemble of coded apertures is minimum.

C. At every row, the inter-column spectral correlation of every 2D array of the ensemble of coded apertures is minimum.

D. At every row, the inner product of a vector of elements across the spectral axis with the neighboring vectors, also across the spectral axis within L positions of each other, is minimum, where the inner product is computed circularly and monotonically rotated. and where L is the number of spectral bands of the system.

Optimal arrays of coded apertures may additionally have one or more of the following mathematical features:

A. The optical set of coded apertures produces a matrix transfer function of the optical system, which satisfies a Restricted Isometry Property.

B. The reconstruction error of an l1-l2 (Manhattan-Euclidean norm) optimization algorithm, based on compressive measurements taken with the optimal set of coded apertures, is minimum.

Figure 2:
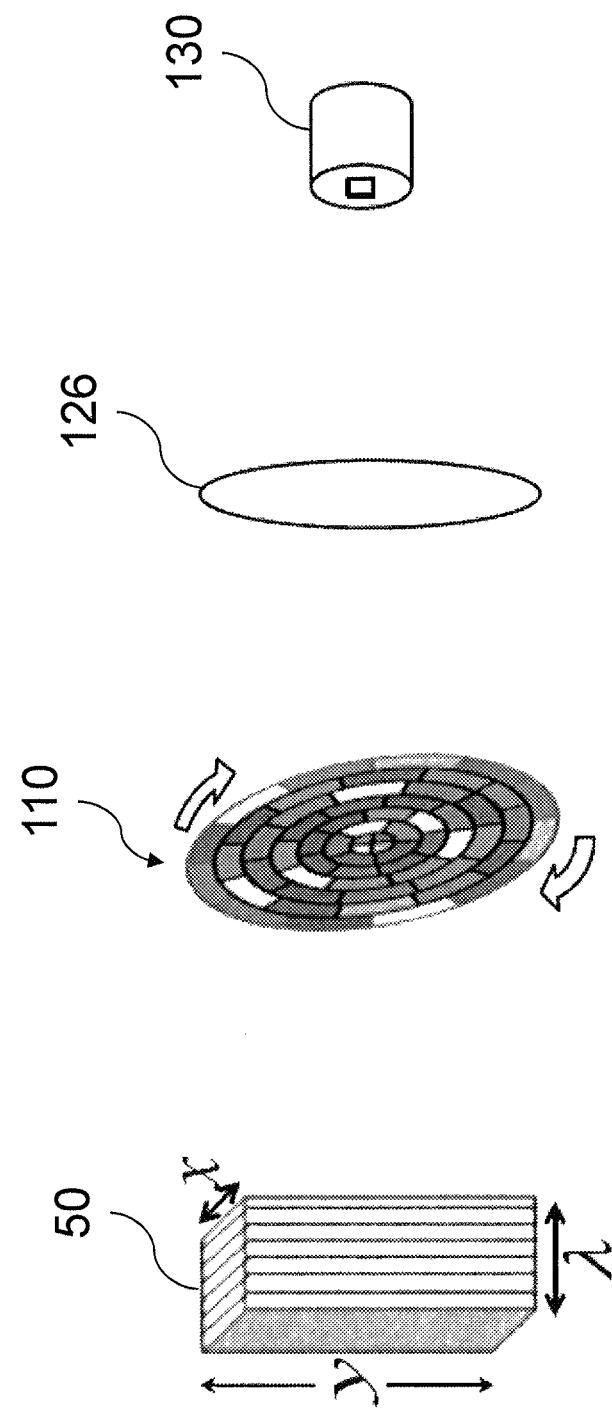
FIG. 2 is a diagram illustrating an alternative color-coded array of the spectral imaging sensor of FIG. 1.

As shown in FIG. 1, color-coded array 110 may comprise a linear array of apertures, arranged in rows and columns in a direction orthogonal to the light from object 50. However, it will be understood that array 110 may have other shapes or arrangements. For example, as shown in FIG. 2, color-coded array 110 may comprise a circular array of apertures, arranged in a disc orthogonal to the light from object 50. Other suitable shapes and arrangements of color-coded array 110 will be known to one of ordinary skill in the art from the description herein.

Optical elements 120 are positioned to receive light passing through color-coded array 110. Optical elements 120 are configured to redirect the light from color-coded array 110 onto photodetector 130. Where photodetector 130 comprises a photodetector array, optical elements 120 are configured to redirect light onto particular positions of the photodetector array.

In an exemplary embodiment, optical elements 120 include an imaging lens 122 and a prism 124, as shown in FIG. 1. Imaging lens 122 focuses the light from color-coded array 110, and prism 124 refracts the light passing through imaging lens 122. Suitable lenses and prisms for use as optical elements 120 will be known to one of ordinary skill in the art from the description herein.

Refraction of the light with prism 124 separates the different wavelength bands of light passing through color-coded array 110. This is because the amount of refraction caused by prism 124 is dependent on the wavelength of the light passing therethrough. In other words, prism 124 will refract longer wavelength (e.g. red) light to a greater extent than it will shorter wavelength (e.g. blue) light. Due to this refraction, prism 124 will cause different wavelengths of light from the same region of object 50 to strike photodetector 130 at different locations (due to the different amounts of refraction). Where photodetector 130 is a photodetector array of pixels, each pixel will receive spectral information about object 50 from differential spatial areas of the light from object 50.

In another embodiment, optical elements 120 may include an optical condenser 126, as shown in FIG. 2. Optical condenser 126 is configured to redirect the light from the circular color-coded array 110 into a convergent beam directed toward photodetector 130. Suitable optical condensers for use as optical elements 120 will be known to one of ordinary skill in the art from the description herein.

Optical elements 120 are not limited to the elements described herein. Other suitable optical elements for use in sensor 100 will be known to one of ordinary skill in the art from the description herein. For example, other suitable optic elements include diffractive elements such as gratings, or convolution-type apertures such as a Modified Uniformly Redundant Array (MURA).

Photodetector 130 is positioned to receive light from optical elements 120. Photodetector 130 collects the light passing through color-coded array 110 and converts it into spatio-spectral image information about object 50. Photodetector 130 may be configured to detect light in any region of the optical electromagnetic spectrum.

In an exemplary embodiment, photodetector 130 comprises a photodetector array of pixels, such as a focal plane array, as shown in FIG. 1. Suitable focal plane arrays for use as part of sensor 100 will be known to one of ordinary skill in the art from the description herein.

In another embodiment, photodetector 130 comprises a single pixel photodetector, as shown in FIG. 2. The single pixel photodetector is positioned to receive the convergent beam from optical condenser 126. Suitable single pixel photodetectors for use as part of sensor 100 will be known to one of ordinary skill in the art from the description herein.

It will be understood by one of ordinary skill in the art that sensor 100 is not limited to the above-described components, but may include alternative or additional components as would be understood to one of ordinary skill in the art.

For example, sensor 100 may include an objective lens 140, as shown in FIG. 1. Objective lens 140 is positioned to receive the light from object 50, and is positioned between object 50 and color-coded array 110. The relative distances between each of the components of sensor 100 will be readily ascertainable by one of ordinary skill in the art from the description herein.

In particular, the distance f illustrated in FIG. 1 directly depends on the used objective lens. This relates to the focal length from the lens to the plane where the optical images are formed (i.e., the image plane of the objective lens). The distance d illustrated in FIG. 1 is usually given by the equation d=2f, where f is the focal length of the imaging lens. Similarly, d' is given by the equation d'=2f+f', where f' is the induced focal length of the dispersive element.

Sensor 100 may also include an adjustment mechanism. In an exemplary embodiment, the adjustment mechanism is configured to adjust a position of color-coded array 110 relative to object 50. The adjustment mechanism may be configured to move color-coded array 110 orthogonally to the light from object 50 by a predetermined number of apertures.

Figure 3:
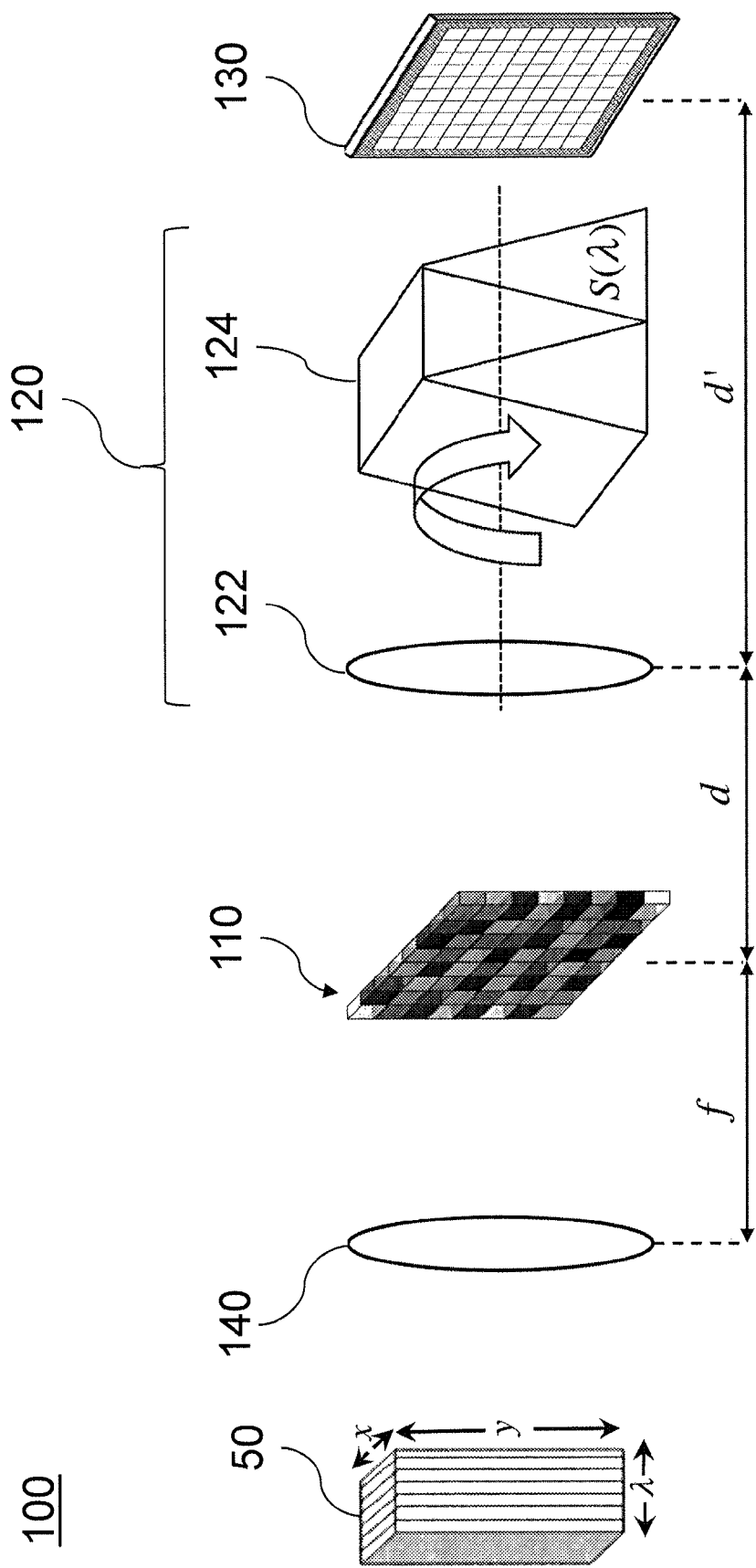
FIG. 3 is a diagram illustrating an alternative adjustment mechanism of the spectral imaging sensor of FIG. 1.

In an alternative embodiment, the adjustment mechanism is configured to adjust a position of the one or more optical elements 120 relative to object 50. For example, adjustment mechanism may be configured to move prism 124, as shown in FIG. 3. Adjustment mechanism may rotate prism 124 orthogonally relative to the light from object 50 by a predetermined amount (e.g., 180°) based on the layout of photodetector 130. Moving color-coded array 110 or prism 124 may be important for measuring multiple sets of data about object 50 with sensor 100, in order to create a spectral image, as is explained in greater detail below.

In an exemplary embodiment, the adjustment mechanism comprises a piezoelectric device. The piezoelectric device can adjust the position of color-coded array 110 or prism 124 based on an applied voltage. The amount of adjustment can be dependent on a magnitude of the applied voltage. Suitable piezoelectric devices for use as the adjustment mechanism will be known to one of ordinary skill in the art from the description herein.

Figure 4:
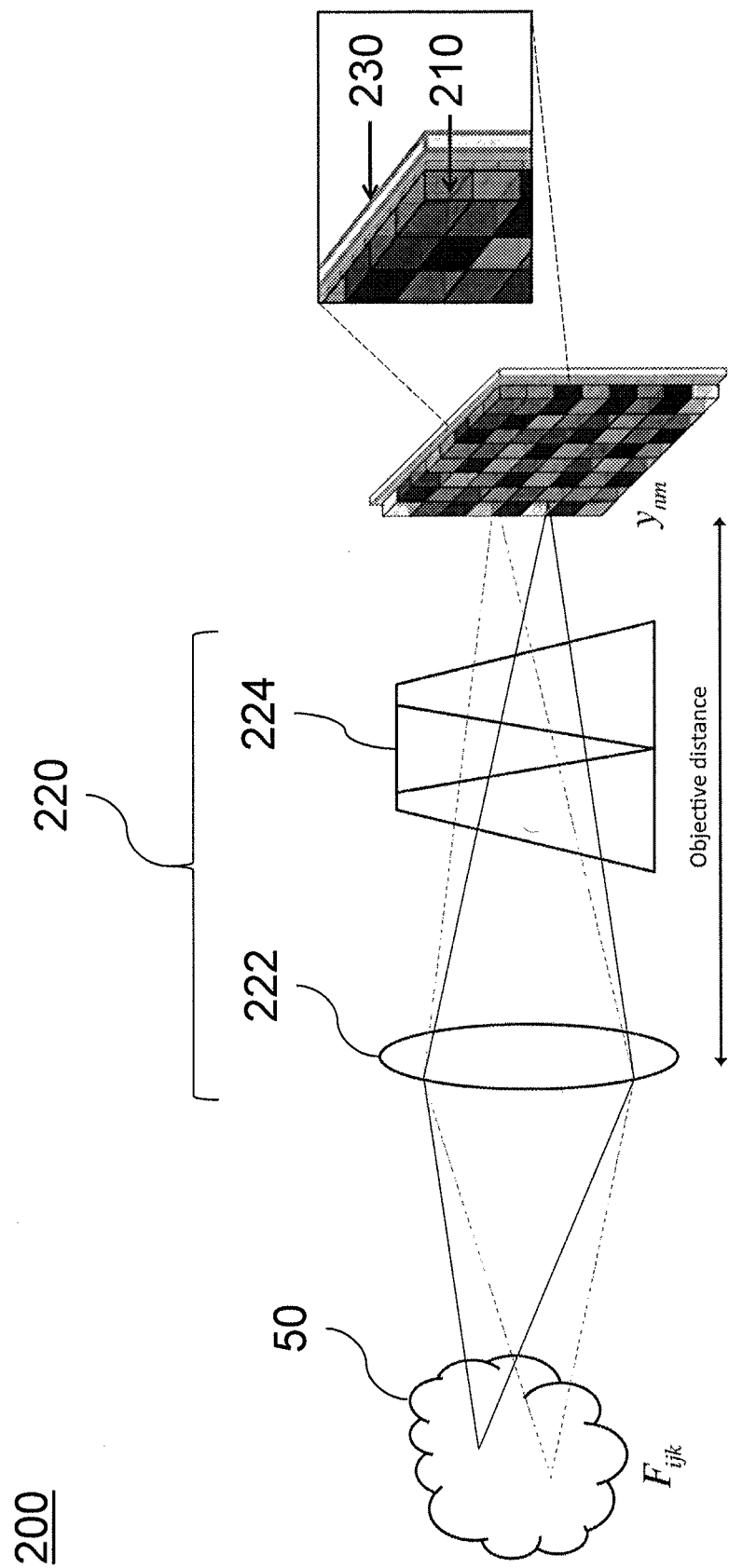
FIG. 4 is a diagram illustrating an alternative exemplary spectral imaging sensor in accordance with aspects of the present invention.

FIG. 4 illustrates another exemplary spectral imaging sensor 200 in accordance with aspects of the present invention. Sensor 200 may also be usable in photographic or spectroscopic systems. In general, sensor 200 includes a color-coded array 210, optical elements 220, and a photodetector 230. Sensor 200 includes the same features as sensor 100 except as described below.

Optical elements 220 are positioned to receive light from the object 50 to be imaged. Optical elements 220 are configured to redirect the light from object 50 onto photodetector array 230 through color-coded array 210.

In an exemplary embodiment, optical elements 220 include an objective lens 222 and a prism 224, as shown in FIG. 4. Objective lens 222 focuses the light from object 50, and prism 224 refracts the light passing through objective lens 222. Refraction of the light with prism 224 separates the different wavelength bands of light before the light passes through color-coded array 210. Suitable lenses and prisms for use as optical elements 220 will be known to one of ordinary skill in the art from the description herein.

Photodetector array 230 is positioned to receive light from optical elements 220. In an exemplary embodiment, photodetector array 230 comprises a focal plane array, as shown in FIG. 4. Suitable focal plane arrays for use as part of sensor 200 will be known to one of ordinary skill in the art from the description herein.

Color-coded array 210 is positioned adjacent a surface of photodetector array 230 between photodetector array 230 and optical elements 220. Color-coded array 210 is formed from an array of different colored apertures that are configured to pass light from object 50 therethrough, substantially as described above with respect to color-coded array 110.

The positioning of the apertures in color-coded array 210 may impact the ability of sensor 200 to obtain the desired spatio-spectral information about object 50. In one exemplary embodiment, the positioning of the plurality of apertures in color-coded array 210 is randomly predetermined. In another exemplary embodiment, the positioning of the plurality of apertures in color-coded array 210 is selected based on the locations at which the light passing through color-coded array 210 will contact photodetector array 230.

As shown in FIG. 4, color-coded array 210 may be formed on the front surface of photodetector array 230. Accordingly, color-coded array 210 and photodetector array 230 may be formed as an integral, compact, independent component of sensor 200, which can be combined with the requisite optical elements following production. In this embodiment, each of the apertures in color-coded array 210 may correspond to a single pixel in photodetector array 230, or may correspond to multiple pixels in photodetector array 230.

The apertures in array 210 may comprise transmissive lithographic coatings formed on the surface of a photodetector array 230 such as a focal plane array. Alternatively, the apertures in array 210 may comprise microscopic wedge filters formed integrally with photodetector array 230 in order to implement pixel-level Fabry-Perot interferometers (FPI). In this embodiment, the colors for each plurality of apertures may be determined by the length of the cavity on the FPI for each pixel.

Sensor 200 may also include an adjustment mechanism. In an exemplary embodiment, the adjustment mechanism is configured to adjust a position of the one or more optical elements 220 relative to object 50, as discussed above with respect to sensor 100.

Figure 5:
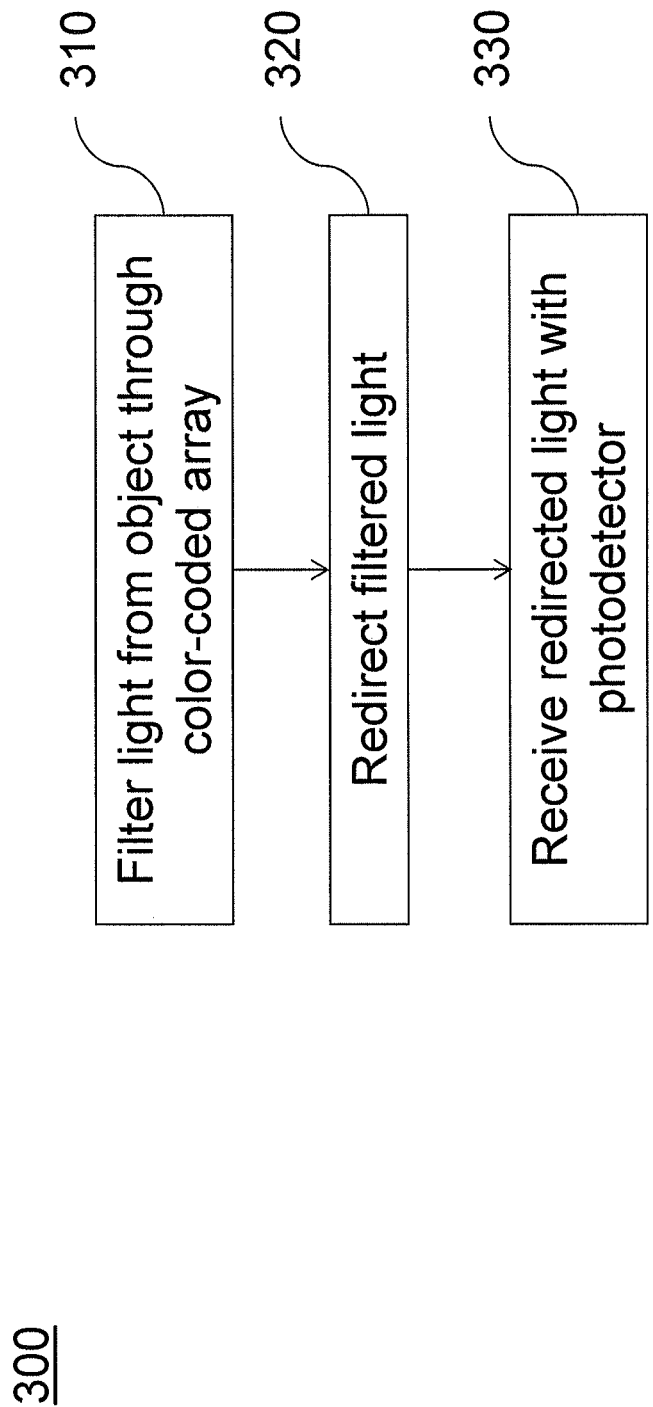
FIG. 5 is a flowchart illustrating an exemplary spectral imaging method in accordance with aspects of the present invention.

FIG. 5 illustrates an exemplary method 300 for spectral imaging in accordance with aspects of the present invention. Method 300 may also be usable for photographic or spectroscopic imaging. In general, method 300 includes the steps of filtering light with a color-coded array, redirecting the filtered light, and receiving the redirected light. Additional details of method 300 are described below with respect to the components of sensor 100.

In step 310, light from an object to be imaged is filtered. In an exemplary embodiment, light from object 50 is filtered by passing through color-coded array 110. The filtering is based on the colors of the first plurality of apertures 112 and the second plurality of apertures 114. As explained above, first plurality of apertures 112 are configured to pass light in a first predetermined wavelength range based on the first color, and second plurality of apertures 114 are configured to pass light in a second predetermined wavelength range based on the second color. Color-coded array 110 may also include different colors, or may include a plurality of apertures 116 that are black or otherwise optically opaque, and are thereby configured to block the passage of light therethrough.

In step 320, the filtered light is redirected. In an exemplary embodiment, optical elements 120 redirect the filtered light from color-coded array 110. For example, prism 124 may refract the filtered light in order to separate the different wavelength bands of light filtered through color-coded array 110.

In step 330, the redirected light is received. In an exemplary embodiment, photodetector 130 receives the light redirected by optical elements 120. Photodetector 130 converts the light filtered by color-coded array 110 and redirected by optical elements 120 into spectral image information about object 50. This information is then utilized by photodetector, along with several processing elements (not shown) to create a spectral image of object 50. Suitable algorithms for creating a spectral image from the filtered light received by photodetector 130 will be known to one of ordinary skill in the art from the description herein.

It will be understood by one of ordinary skill in the art that method 300 is not limited to the above-described steps, but may include alternative or additional components as would be understood to one of ordinary skill in the art.

For example, sensor 100 may include an objective lens 140, as shown in FIG. 1. In this embodiment, method 300 may include the step of focusing the light from object 50 onto color-coded array 110 with objective lens 140.

For another example, method 300 may also include repeating steps 310-330 using a different color-coded array. The use of a different color-coded array may be important for measuring multiple different sets of data about object 50 with sensor 100.

Measuring multiple sets of data using different color-coded filters desirably enables sensor 100 to accurately recreate a spectral image of object 50. The quality of the reconstructed signal depends on the number of measurements taken of object 50 and the structure of the different color-coded arrays 110 used to take those measurements. By optimizing the design and positioning of the apertures in color-coded arrays 110 (as described above), the disclosed method desirably minimizes the required number of measurements, and increases the accuracy of the spectral images acquired.

In order to use a different color-coded array in the filter step 310, sensor 100 may include multiple distinct color-coded arrays 110. However, in an alternative embodiment, sensor 100 may include an adjustment mechanism for moving either color-coded array 110 or prism 124, as described above. In this embodiment, the different color-coded array used in the repeated filter step 310 may comprise a position-adjusted version of the original color-coded array 110. In other words, the adjustment mechanism creates the different color-coded array by adjusting a position of color-coded array 110 relative to object 50, so that the light from object 50 passes through different apertures in color-coded array 110. Where color-coded array 110 is a linear array of apertures, as shown in FIG. 1, this adjustment may be made by linearly moving color-coded array 110. Where color-coded array 110 is a circular array of apertures, as shown in FIG. 2, this adjustment may be made by rotating color-coded array 110 around a central axis thereof. Such movement of color-coded array may be made a predetermined distance based on a number of apertures to be moved in each case.

The disclosed systems and methods are particularly suitable for use in compressive spectral imaging (CSI). The disclosed embodiments desirably limit the number of sensors required to obtain a highly detailed spectral image, and the amount of processing necessary by enabling a greater amount of spatio-spectral information to be obtained in a lower number of data acquisitions (e.g., in as low as one, two, or three acquisitions of light from object 50). As such, the sensors disclosed herein are significantly more efficient than conventional spectral imaging sensors, in terms of both spectral and spatial resolution, and in measurement time.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A spectral imaging sensor comprising:
a color-coded array of apertures positioned to receive light from an object to be imaged, the array including a first plurality of apertures configured to pass light in a first predetermined wavelength range and a second plurality of apertures configured to pass light in a second predetermined wavelength range different from the first predetermined wavelength range;
one or more optical elements positioned to receive light passing through the color-coded array;
a photodetector positioned to receive light from the one of more optical elements; and
an adjustment mechanism configured to adjust a position of the color-coded array relative to the object to be imaged.

2. The spectral imaging sensor of claim 1, wherein
the array includes a third plurality of apertures configured to pass light in a third predetermined wavelength range different from the first and second predetermined wavelength ranges.

3. The spectral imaging sensor of claim 1, wherein
the first predetermined wavelength range comprises wavelengths at or above a predetermined wavelength, and the second predetermined wavelength range comprises wavelengths below the predetermined wavelength.

4. The spectral imaging sensor of claim 1, further comprising an objective lens positioned to receive the light from the object to be imaged, the objective lens positioned between the object to be imaged and the color-coded array of apertures.

5. The spectral imaging sensor of claim 1, wherein the color-coded array comprises a linear array of apertures.

6. A spectral imaging sensor comprising:
a color-coded array of apertures positioned to receive light from an object to be imaged, the array including a first plurality of apertures configured to pass light in a first predetermined wavelength range and a second plurality of apertures configured to pass light in a second predetermined wavelength range different from the first predetermined wavelength range;
one or more optical elements positioned to receive light passing through the color-coded array; and
a photodetector positioned to receive light from the one of more optical elements, wherein
a positioning of the first plurality of apertures and the second plurality of apertures in the color-coded array is randomly predetermined.

7. A spectral imaging sensor comprising:
a color-coded array of apertures positioned to receive light from an object to be imaged, the array including a first plurality of apertures configured to pass light in a first predetermined wavelength range and a second plurality of apertures configured to pass light in a second predetermined wavelength range different from the first predetermined wavelength range;
one or more optical elements positioned to receive light passing through the color-coded array; and
a photodetector positioned to receive light from the one of more optical elements, wherein
the photodetector comprises a photodetector array; and
a positioning of the first plurality of apertures and the second plurality of apertures in the color-coded array is predetermined based on locations at which the light passed by the first plurality of apertures and the light passed by the second plurality of apertures contact the photodetector array.

8. A spectral imaging sensor comprising:
a color-coded array of apertures positioned to receive light from an object to be imaged, the array including a first plurality of apertures configured to pass light in a first predetermined wavelength range and a second plurality of apertures configured to pass light in a second predetermined wavelength range different from the first predetermined wavelength range;
one or more optical elements positioned to receive light passing through the color-coded array; and
a photodetector positioned to receive light from the one of more optical elements,
wherein the color-coded array comprises a linear array of apertures, and wherein the one or more optical elements comprise a prism configured to refract the light passing through the color-coded array.

9. The spectral imaging sensor of claim 8, further comprising an adjustment mechanism for adjusting a position of the prism relative to the object to be imaged.

10. A spectral imaging sensor comprising:
a color-coded array of apertures positioned to receive light from an object to be imaged, the array including a first plurality of apertures configured to pass light in a first predetermined wavelength range and a second plurality of apertures configured to pass light in a second predetermined wavelength range different from the first predetermined wavelength range;
one or more optical elements positioned to receive light passing through the color-coded array; and
a photodetector positioned to receive light from the one of more optical elements, wherein the color-coded array comprises a circular array of apertures.

11. A spectral imaging sensor comprising:
one or more optical elements positioned to receive light from an object to be imaged;
a photodetector array positioned to receive light passing through the one of more optical elements;
a color-coded array of apertures positioned adjacent a surface of the photodetector array between the photodetector array and the one or more optical elements, the color-coded array including a first plurality of apertures configured to pass light in a first predetermined wavelength range and a second plurality of apertures configured to pass light in a second predetermined wavelength range different from the first predetermined wavelength range; and
an adjustment mechanism for adjusting a position of the prism relative to the object to be imaged.

12. The spectral imaging sensor of claim 11, wherein
the array includes a third plurality of apertures configured to pass light in a third predetermined wavelength range different from the first and second predetermined wavelength ranges.

13. The spectral imaging sensor of claim 11, wherein
first predetermined wavelength range comprises wavelengths at or above a predetermined wavelength, and the second predetermined wavelength range comprises wavelengths below the predetermined wavelength.

14. A spectral imaging sensor comprising:
one or more optical elements positioned to receive light from an object to be imaged;
a photodetector array positioned to receive light passing through the one of more optical elements; and
a color-coded array of apertures positioned adjacent a surface of the photodetector array between the photodetector array and the one or more optical elements, the color-coded array including a first plurality of apertures configured to pass light in a first predetermined wavelength range and a second plurality of apertures configured to pass light in a second predetermined wavelength range different from the first predetermined wavelength range, wherein
a positioning of the first plurality of apertures and the second plurality of apertures in the color-coded array is randomly predetermined.

15. A spectral imaging sensor comprising:
one or more optical elements positioned to receive light from an object to be imaged;
a photodetector array positioned to receive light passing through the one of more optical elements; and
a color-coded array of apertures positioned adjacent a surface of the photodetector array between the photodetector array and the one or more optical elements, the color-coded array including a first plurality of apertures configured to pass light in a first predetermined wavelength range and a second plurality of apertures configured to pass light in a second predetermined wavelength range different from the first predetermined wavelength range, wherein the one or more optical elements comprise a prism configured to deflect the light from the object to be imaged.

16. A spectral imaging method comprising the steps of:
filtering light from an object to be imaged through a color-coded array of apertures, the array including a first plurality of apertures configured to pass light in a first predetermined wavelength range and a second plurality of apertures configured to pass light in a second predetermined wavelength range different from the first predetermined wavelength range;
redirecting the filtered light with one or more optical elements;
receiving the redirected light with a photodetector; and
adjusting a position of the color-coded array relative to the object to be imaged,
wherein the different color-coded array comprises the position-adjusted color-coded array.

17. The spectral imaging method of claim 16, further comprising the step of:
focusing the light from the object to be imaged onto the color-coded array with an objective lens.

18. The spectral imaging method of claim 16, further comprising the step of:
repeating the filtering step using a different color-coded array.

19. The spectral imaging method of claim 16, wherein the color-coded array comprises a circular array of apertures, and the adjusting step comprises rotating the color-coded away around a central axis thereof.

20. A spectral imaging method comprising the steps of:
filtering light from an object to be imaged through a color-coded array of apertures, the array including a first plurality of apertures configured to pass light in a first predetermined wavelength range and a second plurality of apertures configured to pass light in a second predetermined wavelength range different from the first predetermined wavelength range;
redirecting the filtered light with one or more optical elements; and
receiving the redirected light with a photodetector, wherein the redirecting step comprises refracting the filtered light with a prism.

21. The spectral imaging method of claim 20, further comprising the step of:
adjusting a position of the prism relative to the object to be imaged.

* * * * *